(12) United States Patent
Hosseini

(10) Patent No.: US 8,723,299 B2
(45) Date of Patent: May 13, 2014

(54) METHOD AND SYSTEM FOR FORMING A THIN SEMICONDUCTOR DEVICE

(75) Inventor: Khalil Hosseini, Weihmichl (DE)

(73) Assignee: Infineon Technologies AG, Neubiberg (DE)

( * ) Notice: Subject to any disclaimer, the term of this patent is extended or adjusted under 35 U.S.C. 154(b) by 191 days.

(21) Appl. No.: 12/790,998

(22) Filed: Jun. 1, 2010

(65) Prior Publication Data

US 2011/0291252 A1    Dec. 1, 2011

(51) Int. Cl.
*H01L 23/495*    (2006.01)

(52) U.S. Cl.
USPC ........... 257/676; 257/678; 257/686; 257/777; 257/E21.499; 257/E23.031

(58) Field of Classification Search
USPC .................. 257/678, 686, 777, 787, E23.035, 257/E23.054, E23.067, E23.068; 438/107, 438/109, 111, 123
See application file for complete search history.

(56) References Cited

U.S. PATENT DOCUMENTS

| | | | |
|---|---|---|---|
| 6,404,063 B2 * | 6/2002 | Farnworth et al. | 257/778 |
| 6,437,427 B1 * | 8/2002 | Choi | 257/666 |
| 6,753,207 B2 * | 6/2004 | Hur | 438/109 |
| 7,642,128 B1 | 1/2010 | Lin et al. | |
| 7,754,531 B2 * | 7/2010 | Tay et al. | 438/112 |
| 7,911,070 B2 * | 3/2011 | Pagaila et al. | 257/787 |
| 2001/0002119 A1 * | 5/2001 | Winterer et al. | 338/42 |
| 2002/0113131 A1 * | 8/2002 | Puschner et al. | 235/492 |
| 2003/0136998 A1 | 7/2003 | Baniecki et al. | |
| 2003/0147215 A1 * | 8/2003 | Weng | 361/700 |
| 2003/0203540 A1 * | 10/2003 | Hur | 438/111 |
| 2005/0146005 A1 * | 7/2005 | Shimoishizaka et al. | 257/678 |
| 2005/0146008 A1 * | 7/2005 | Miyamoto et al. | 257/686 |
| 2005/0212082 A1 | 9/2005 | Takeda et al. | |
| 2005/0236690 A1 | 10/2005 | Chung | |
| 2006/0216868 A1 * | 9/2006 | Yang et al. | 438/125 |
| 2007/0262346 A1 * | 11/2007 | Otremba et al. | 257/177 |
| 2007/0264751 A1 | 11/2007 | Chia et al. | |
| 2009/0079089 A1 | 3/2009 | Brunnbauer et al. | |
| 2009/0079090 A1 | 3/2009 | Pressel et al. | |
| 2009/0236749 A1 | 9/2009 | Otremba et al. | |
| 2009/0309212 A1 | 12/2009 | Shim et al. | |

FOREIGN PATENT DOCUMENTS

| | | |
|---|---|---|
| DE | 20021698 U1 | 11/2000 |
| DE | 10 2005 056 906 A1 | 5/2007 |

* cited by examiner

*Primary Examiner* — Mamadou Diallo

(57) ABSTRACT

A method and system for forming a thin semiconductor device are disclosed. In one embodiment, a lead frame is provided over a carrier. At least one semiconductor chip is provided on the lead frame and the at least one semiconductor chip is enclosed with an encapsulating material. The thickness of the at least one semiconductor chip and the encapsulating material are reduced. At least one through connection is formed in the encapsulating material and at least one electrical contact element is formed over the at least one semiconductor chip and the at least one through connection.

5 Claims, 6 Drawing Sheets

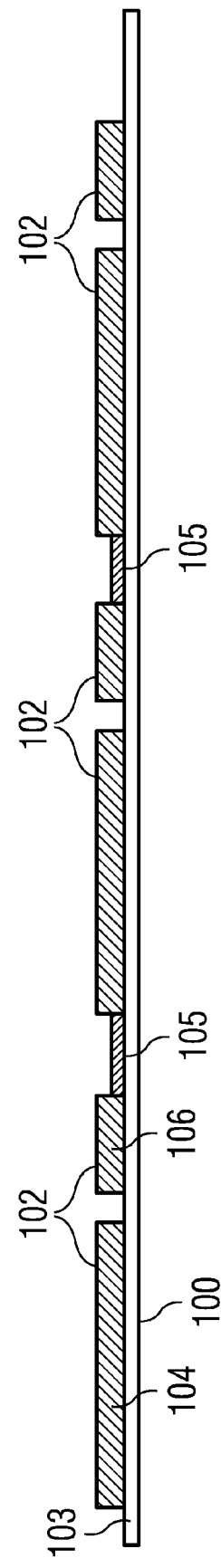
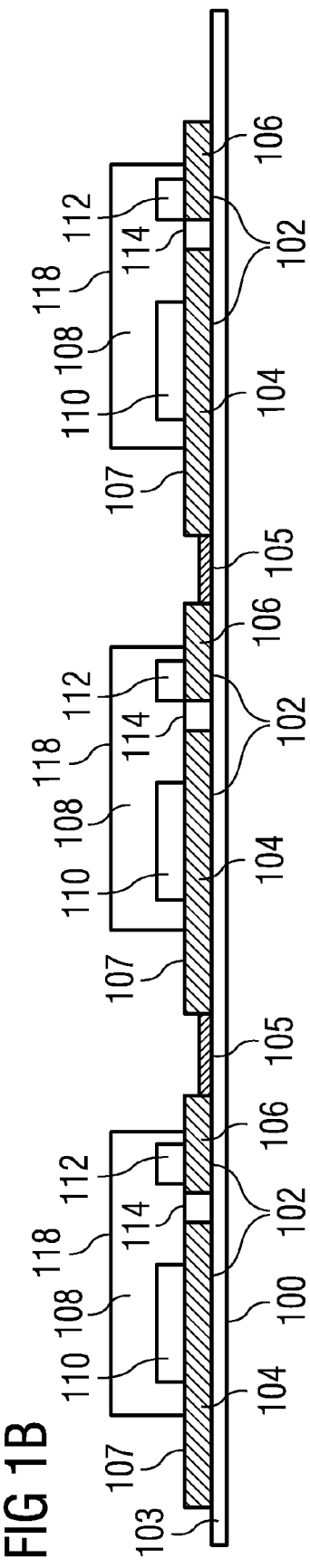

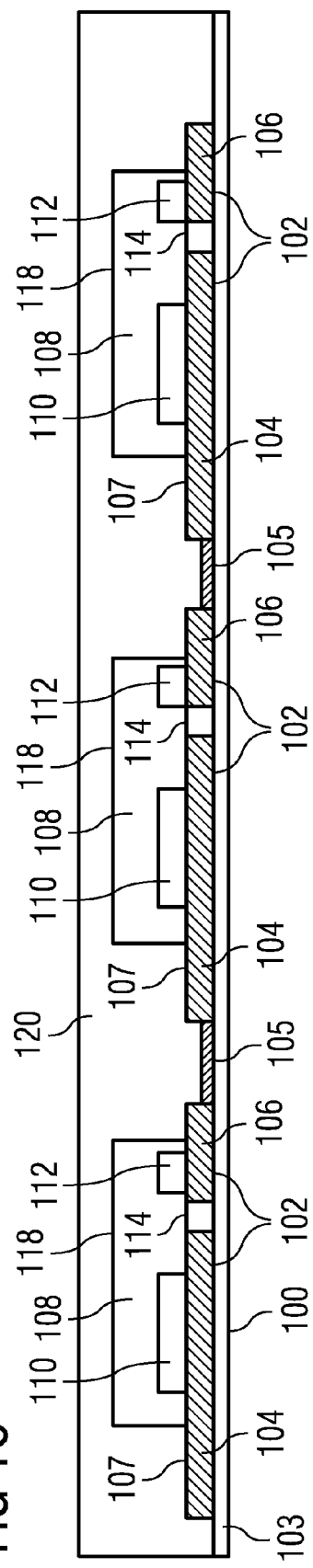
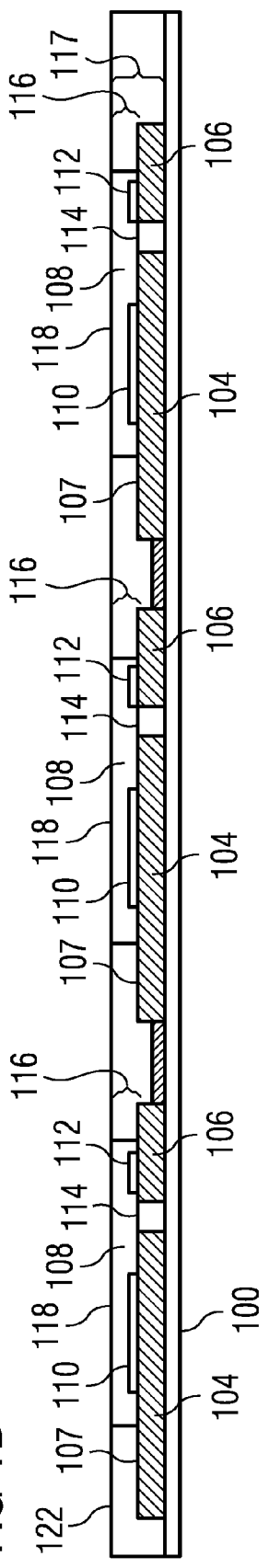

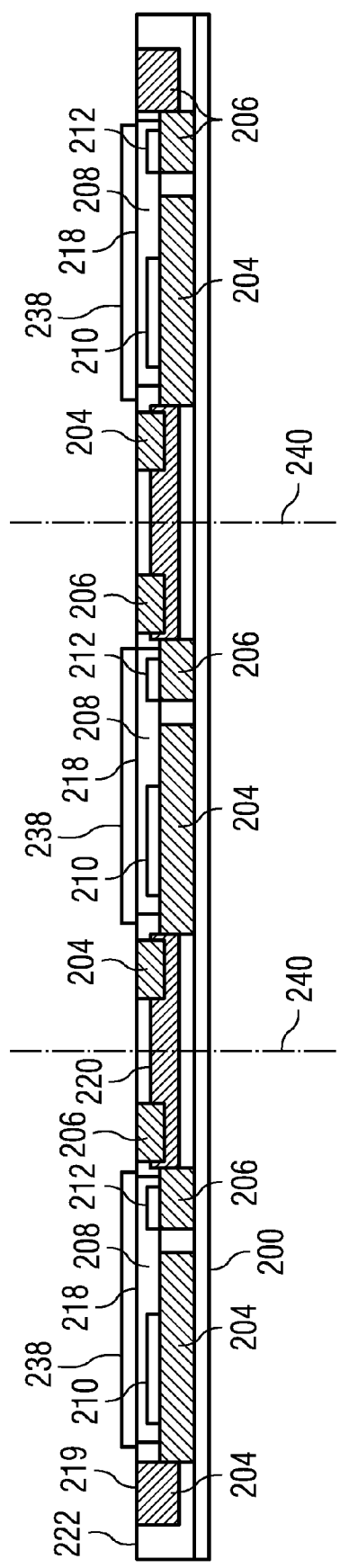

METHOD AND SYSTEM FOR FORMING A THIN SEMICONDUCTOR DEVICE

TECHNICAL FIELD

The present invention relates generally to forming a thin semiconductor device. In particular, the present disclosure relates to a method and system for forming a thin semiconductor device in a thin semiconductor package for power applications.

BACKGROUND

Power semiconductor chips may be integrated into electronic devices. Power semiconductor chips are suitable, for example, for switching or control of currents and/or voltages. Examples of power semiconductor chips include power MOSFETs, IGBTs, JFETs, power bipolar transistors, and power diodes.

The demand for thinner power semiconductor chips, for example, with a thickness of less than 150 um has increased recently. Therefore, a need exists for a method and a system for producing thinner power semiconductor chips in thin semiconductor packages.

BRIEF DESCRIPTION OF DRAWINGS

FIGS. 1A-1F are diagrams illustrating an exemplary process for forming a thin semiconductor chip in accordance with one embodiment of the present disclosure.

FIGS. 2A-2E are diagrams illustrating an exemplary process for forming a thin semiconductor chip in accordance with an alternative embodiment of the present disclosure.

SUMMARY OF INVENTION

Figure 1E:
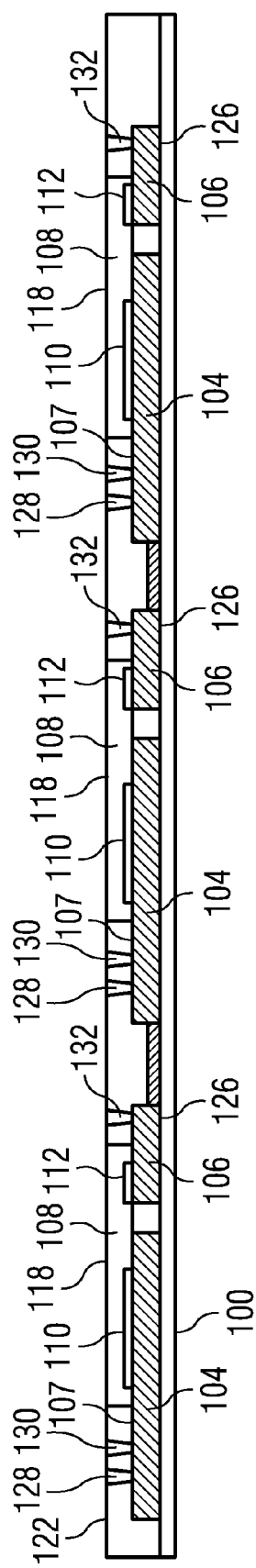

The present disclosure provides a method and a system for producing a thin semiconductor device. In one embodiment, the method comprises providing a lead frame over a carrier, providing at least one semiconductor chip on the lead frame, enclosing the at least one semiconductor chip with an encapsulating material, reducing thickness of the at least one semiconductor chip and the encapsulating material, forming at least one through connection in the encapsulating material, and forming at least one electrical contact element over the at least one semiconductor chip and the at least one through connection.

In another embodiment, the method comprises providing a lead frame having at least one connection element, providing at least one semiconductor chip on the lead frame, enclosing the at least one semiconductor chip and the lead frame with an encapsulating material, reducing thickness of the at least one semiconductor chip and the encapsulating material, and forming an electrical contact element over the at least one semiconductor chip.

DETAIL DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Devices with semiconductor chips are described below. The semiconductor chips may be of extremely different types, may be manufactured by different technologies and may include for example, integrated electrical or electro-optical circuits or passives or MEMS etc. Semiconductor chips may be configured, for example, as power transistors, power diodes, IGBTs (Isolated Gate Bipolar Transistors). Semiconductor chips may have a vertical structure and may be fabricated in such a way that electrical currents can flow in a direction perpendicular to the main surfaces of the semiconductor chips. These semiconductor chips may have contact elements disposed on its main surfaces, which includes a top surface and a bottom surface. Examples of semiconductor chips having a vertical structure include power transistors and power diodes. In case of power transistors, the source electrode and the gate electrode may be disposed on a first main surface while the drain electrode may be disposed on a second main surface. In case of a power diode, the anode electrode may be disposed on a first main surface while the cathode electrode may be disposed on a second main surface.

The integrated circuits may, for example, be designed as logic integrated circuits, analog integrated circuits, mixed signal integrated circuits, power integrated circuits, memory circuits or integrated passives. Furthermore, the semiconductor chips may be configured as MEMS (micro-electro mechanical systems) and may include micro-mechanical structures, such as bridges, membranes or tongue structures. The semiconductor chips may be configured as sensors or actuators, for example, pressure sensors, acceleration sensors, rotation sensors, microphones etc. The semiconductor chips may be configured as antennas and/or discrete passives. The semiconductor chips may also include antennas and/or discrete passives. Semiconductor chips, in which such functional elements are embedded, generally contain electronic circuits which serve for driving the functional elements or further process signals generated by the functional elements. The semiconductor chips need not be manufactured from specific semiconductor material and, furthermore, may contain inorganic and/or organic materials that are not semiconductors, such as for example, discrete passives, antennas, insulators, plastics or metals. Moreover, the semiconductor chips may be packaged or unpackaged.

The semiconductor chips have contact pads which allow electrical contact to be made with the semiconductor chips. The contact pads may be composed of any desired electrically conductive material, for example, of a metal, such as aluminum, nickel, palladium, gold or copper, a metal alloy, a metal stack or an electrically conductive organic material. The contact pads may be situated on the active main surfaces of the semiconductor chips or on other surfaces of the semiconductor chips. The active or passive structures of the semiconductor chips are usually arranged below the active main surfaces and can be electrically contacted via the contact pads. In case of power transistors, the contact pads may be drain, source or date electrodes.

The devices described in the following may include external contact pads that are accessible from outside of the devices to allow electrical contact to be made from outside of the devices. In addition, the external contact pads may be thermally conductive and serve as heat sinks for heat dissipation of the semiconductor chips. The external contact pads may be composed of any electrically conductive material, for example, a metal such as copper, Pd, Ni, Au, etc.

The devices described in the following may include an encapsuling material covering at least parts of the semiconductor chips. The encapsulating material is an electrically insulating material, which is at most marginally electrically conductive relative to the electrically conductive components of the device. Examples of an encapsulating material include a mold material and an epoxy based material. The encapsulating material may be any appropriate duroplastic, thermoplastic, laminate (prepreg) or thermosetting material and may contain filler materials. Various techniques may be employed to cover the semiconductor chips with the mold material, for example, compression molding, lamination or injection molding.

FIGS. 1A to 1F are diagrams illustrating an exemplary process for producing a thin semiconductor device in accordance with one embodiment of the present disclosure. As shown in FIG. 1A, a carrier 100 is provided and a lead frame 102 is fixed on the carrier 100. The lead frame 102 may be composed of a metal, such as copper, a copper alloy, or copper-plated with nickel, gold, or any other metallic material. The lead frame 102 may also be pre-plated lead frame (PPF). The shape of lead frame 102 is not limited to any size or geometric shape, for example, lead frame 102 may be round or square shaped or endless (reel to reel). The lead frame 102 may be fixed on carrier 100 by using an adhesive, such as an adhesive tape. However, the lead frame 102 may be fixed on carrier 100 using other methods or materials without departing the spirit and scope of the present disclosure.

In one embodiment, lead frame 102 comprises a plurality of connection lead frame (LF) elements, such as connection LF elements 104 and 106 that are deposited on a first surface 103 of carrier 100. In one example, connection LF elements 104 may be source connection elements and connection LF elements 106 may be gate connection elements. However, connection LF elements of other types may be implemented without departing the spirit and scope of the present disclosure. In this embodiment, tie bars 105 may be disposed on the first surface 103 of carrier 100 to connect connection LF elements of different lead frames 102, for example connection LF elements 104 of one lead frame 102 and connection LF elements 106 of another lead frame 102.

Referring to FIG. 1B, one or more semiconductor chips 108 may be placed over the connection LF elements 104, 106 of lead frame 102. Semiconductor chips 108 may be vertical power diodes, IGBTs, or power transistors, such as power MOSFETs. Semiconductor chips 108 may be fabricated on a wafer made of a semiconductor material. After dicing the wafer and separating individual semiconductor chips 108, semiconductor chips 108 may be attached to a lead frame in larger spacings as they have been in the wafer bond. Semiconductor chips 108 may be manufactured on the same wafer or different wafers. Semiconductor chips 108 may be identical chips or chips with different integrated circuits.

Semiconductor chips 108 may comprise source electrodes 110 and gate electrodes 112 that are disposed on a first surface 114 of the semiconductor chips 108. In one embodiment, connection LF elements 104 are electrically coupled to source electrodes 110 and connection LF elements 106 are electrically coupled to gate electrodes 112. The first surface 114 may also be referred to as a front side of the semiconductor chips 108. In one embodiment, electrical connections between connection LF elements 104, 106 of the lead frame 102 and source electrodes 110, gate electrodes 112 of the semiconductor chips 108 may, for example, be produced by diffusion soldering.

A diffusion solder material may be deposited on lead frame 102 and/or source electrodes 110 and gate electrodes 112 of the semiconductor chips 108 by sputtering or other appropriate physical or chemical deposition methods. The solder material may have a thickness in a range of about 500 nm and about 10 um, for example, from about 1 to 3 um. During the soldering operation, the solder material diffuses into the adjacent materials on the lead frame surface 107, which leads to intermetallic phase at the interface between connection LF elements 104, 106 on the lead frame surface 107 and source electrodes 110, gate electrodes 112 of the semiconductor chips 108. The solder material may, for example, consist of AuSn, AgSn, CuSn, Sn, AuIn, AgIn, AuSi, Cu, Bi or CuIn or layer stacks with or without diffusion barrier and or adhesion layer.

In addition, the electrical connections between connection LF elements 104, 106 of the lead frame 102 and source electrodes 110, gate electrodes 112 of the semiconductor chips 108 may, for example, be produced by a flip-chip process in which the solder material is deposited on the semiconductor chips 108 and connection LF elements 104, 106 on the lead frame surface 107 before the semiconductor chips 108 are removed from the wafer and placed over the lead frame surface 107.

Alternatively, electrical connections between connection LF elements 104, 106 of the lead frame 102 and source electrodes 110, gate electrodes 112 of the semiconductor chips 108 may be produced by connection techniques such as soft soldering or solder paste or adhesive bonding by means of an electrically conducting adhesive glue. When using soft soldering technique, solder material remains at the interfaces between the semiconductor chips 108 and lead frame surface 107 after soldering. When using solder paste or adhesive bonding, electrically conducting adhesive material, such as filled or unfilled polymides, epoxy resins, acrylate resins, silicone resins or mixtures thereof, may be used and enriched with gold, silver, nickel, copper or CNT to produce electrical conductivity.

Semiconductor chips 108 may also comprise drain electrodes 116 that are disposed on a second surface 118 of the semiconductor chips 108. The second surface 118 may also be referred to as a back side of the semiconductor chips 108. However, unlike source electrodes 110 and gate electrodes 112 that are disposed on the first surface 114, drain electrodes 116 are not processed and without any metallization on the second surface 118 of the semiconductor chips 108.

Referring to FIG. 1C, after semiconductor chips 108 are placed on the lead frame 102, semiconductor chips 108 and the lead frame 102 are encapsulated by an encapsulating material, for example, a mold material 120 to form a molding. The mold material 120 may be based on an epoxy material and may contain a filler material consisting of small particles or fibers of glass ($SiO_2$) or other electrically insulating mineral filler material such as $Al_2O_3$ or organic filler materials. The thickness of the mold material 120 may be in the range of 100 to 1500 um. In addition to the second surface 118 of the semiconductor chips 108 being covered by mold material 120, side surfaces of semiconductor chips 108 may also be covered with the mold material 120.

Referring to FIG. 1D, after the molding is formed, semiconductor chips 108 are thinned or grinded. In one embodiment, the semiconductor chips 108 are grinded or thinned to a thickness 116 of less than about 150 um, for example, 100 um. During thinning or grinding of semiconductor chips 108, the thickness 117 of the mold material 120 is also reduced, for example, to a thickness of less than about 150 um. In addition, more than one semiconductor chips 108 may be thinned simultaneously.

To thin or grind semiconductor chips 108 and mold material 120, grinding machines that are similar to wafer grinding machines may be used. In one embodiment, etching may be used to reduce thickness of the semiconductor chips 108. After grinding, a damage etching process may be performed to remove transition and crack zones caused by grinding. Alternatively, a chemical mechanical polishing process may be carried out. After thinning or grinding, the top surface 122 of the mold material 120 is substantially coplanar with the exposed second or back surface 118 of the semiconductor chips 108.

Referring to FIG. 1E, after the semiconductor chips 108 are thinned or grinded, through connections may be formed in the mold material 120. In one embodiment, one or more through connections, such as through connections 128 and 130, may be formed in mold material 120 extending from a top surface 122 of the mold material 120 to lead frame surface 107. In this embodiment, external contacts may be made from outside the mold material 120 to source electrodes 110 of semiconductor chips 108 via connection LF elements 104.

In another embodiment, one or more through connections, such as through connections 132, may be formed in the mold material 120 extending from a top surface 122 of the mold material 120 to lead frame surface 107. In this way, external contacts may be made from outside the mold material 120 to gate electrodes 112 of semiconductor chips 108 via connection LF elements 106. Through connections 128, 130, and 132 may be formed by drilling using a laser beam, an etching method or any other method without departing from the spirit and scope of the present disclosure.

After through connections 128, 130, and 132 are formed in mold material 120, through connections 128, 130, and 132 may be filled with an electrically conductive material, such as copper, aluminum, gold, metal alloy, solder material or electrically conductive paste. In one embodiment, the through connections 128, 130, and 132 are not completely filled with an electrically conductive material, but only the walls of the through connections are coated with the conductive material. In that case, a barrier and/or seed layer may be deposited onto the surface 122 of the through connections 128, 130, and 132 and the back surface 118 of the semiconductor chips 108. In this embodiment, a barrier layer may first be deposited over the through connections 128, 130, and 132 and the back surface 118 of the semiconductor chips 108. The barrier layer may be composed of an electrically conductive material, such as titanium or tungsten. In one example, the thickness of the barrier layer may be from about 50 um to about 400 um. Then, a seed layer may be sputtered onto the barrier layer. The seed layer may be composed of an electrically conductive material, such as copper. In one example, the thickness of the seed layer may be from about 50 um to about 400 um.

After through connections 128, 130, and 132 and back surface 118 of semiconductor chips 108 are coated with a barrier and/or seed layer, another layer of electrically conductive material, such as copper, is galvanically deposited. A photoresist is first applied over the barrier and/or seed layer. The photoresist covers the entire barrier and/or seed layer except the back surface 118 of the semiconductor chips 108 and through connections 128, 130, and 132. The photoresist achieves good adhesion to the conductive barrier and/or seed layer and may be removed easily with common wet etching technique. The photoresist is then exposed and developed with resist mask.

An electrically conductive material is then produced by using electrochemical process with external current and is used to fill the through connections 128, 130, and 132. In one embodiment, the layer of electrically conductive material may have a thickness of greater than about 20 um. The electrically conductive material is also disposed over the back side 118 of the semiconductor chips 108.

Figure 1F:
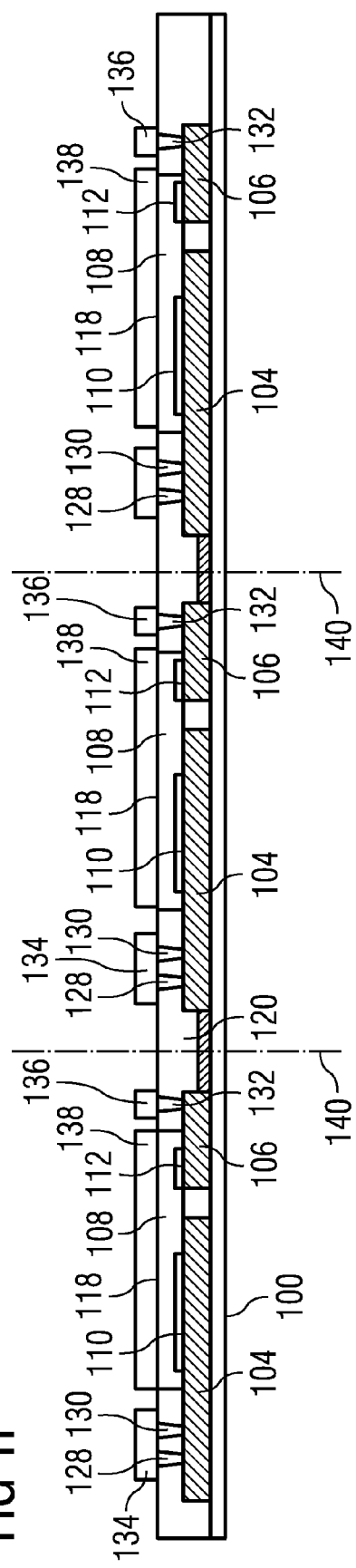

Referring to FIG. 1F, after electrically conductive material fills through connections 128, 130, and 132 and is disposed the back side 118 of the semiconductor chips 108, portions of the electrically conductive material layer are removed to form electrical contact elements 134, 136, and 138. To remove portions of the electrically conductive material, the photoresist is stripped and the barrier and/or seed layer are removed chemically, for example, by wet etching.

After portions of the electrically conductive material layer are removed, electrical contact elements 134 provide electrical contact from outside the mold material 120 to source electrodes 110 of semiconductor chips 108 via through connections 128, 130 and connection LF elements 104. Also in this embodiment, electrical contact elements 136 provide electrical contact from outside mold material 120 to gate electrodes 112 of semiconductor chips 108 via through connections 132 and connection LF elements 106. Furthermore, electrical contact elements 138 provides electrical contact from outside the mold material 120 to drain electrodes 116 that is not processed and without metallization and is disposed on the second surface 118 of semiconductor chips 108.

In the above embodiment, portions of the electrically conductive material layer may be removed by wet etching. However, portions of the electrically conductive material layer may be removed using other methods without departing the spirit and scope of the present disclosure. After electrical contact elements 134, 136, and 138 are formed to provide electrical contact to electrodes of the semiconductor chips 108, an electroless plating process may be performed to enhance electrical bonding of electrical contact elements 134, 136, and 138. A coating composed of metals, such as Ni, Pd, Au, NiAu, etc., may be applied over contact elements 134, 136, and 138 to provide better electrical conductivity to electrical contact elements 134, 136, and 138.

After electroless plating process is completed, semiconductor packages are formed by singulation. In one embodiment, the singulation is performed by singulating the mold material 120 and the lead frame 102 along lines 140. However, singulation along other positions or by other means may be used without departing the spirit and scope of the present disclosure.

Figure 2A:
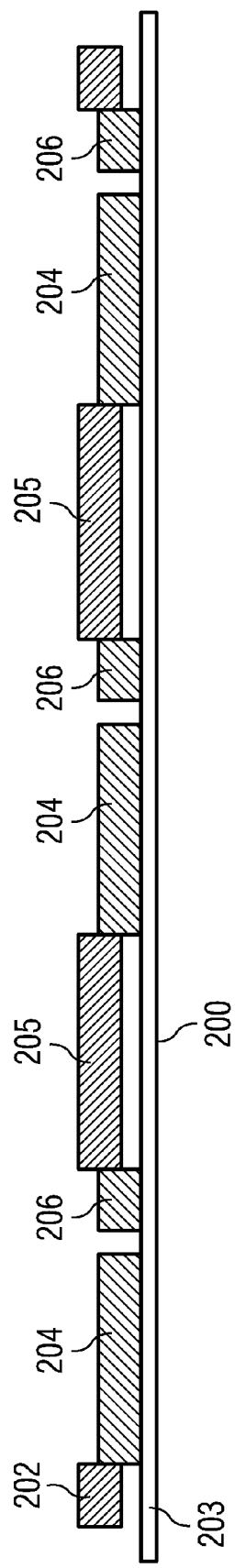

FIGS. 2A to 2E are diagrams illustrating an exemplary process for producing a thin semiconductor device in accordance with an alternative embodiment of the present disclosure. As shown in FIG. 2A, a carrier 200 is provided and a lead frame 202 is fixed on the carrier 200. Lead frame 202 may be a stamped lead frame or an etched lead frame. The shape of lead frame 202 is not limited to any size or geometric shape, for example, lead frame 202 may be round, square shaped or endless. In one embodiment, lead frame 202 may be fixed on the carrier 200 by using an adhesive, such as an adhesive tape. However, other methods or materials may be used to fix lead frame 202 on the carrier 200 without departing the spirit and scope of the present disclosure. The lead frame 202 may be composed of a metal, such as copper, copper alloy, copper-plated with nickel, gold, or any other metallic material. The lead frame 202 may also be pre-plated lead frame (PPF).

Figure 2B:
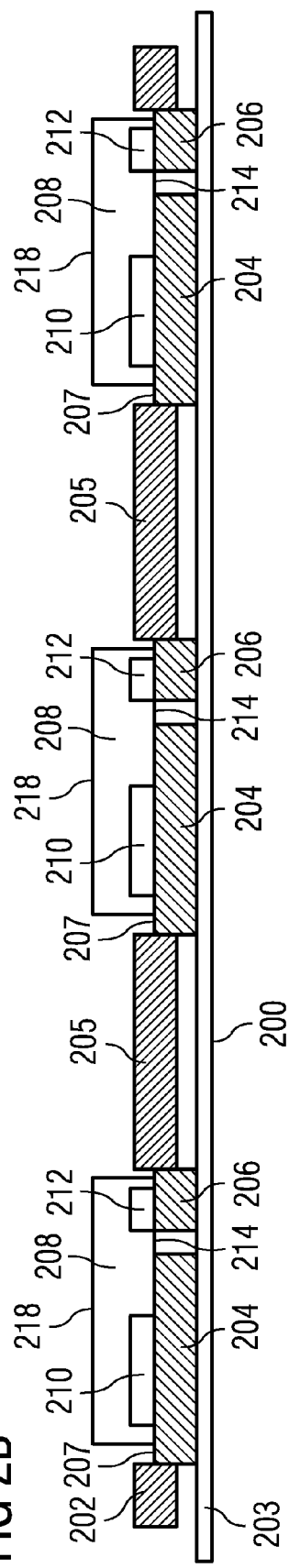

In one embodiment, lead frame 202 comprises a plurality of connection lead frame (LF) elements, such as connection LF elements 204 and 206 that are deposited on a first surface 203 of carrier 200. In one example, connection LF elements 204 may be source connection elements and connection LF elements 206 may be gate connection elements. However, connection LF elements of other types may be implemented without departing the spirit and scope of the present disclosure. In this embodiment, tie bars 205 may be disposed on the first surface 203 of carrier 200 to connect connection LF elements of different lead frames 202, for example, connection LF elements 204 of one lead frame 202 and connection LF elements 206 of another lead frame 202. Referring to FIG. 2B, one or more semiconductor chips 208 may be placed over the connection LF elements 204, 206 of lead frame 202. Semiconductor chips 208 may be vertical power diodes, IGBTs, or power transistors, such as power MOSFETs. Semiconductor chips 208 may be fabricated on a wafer made of a semiconductor material. After dicing the wafer and separating individual semiconductor chips 208, semiconductor chips 208 may be attached to a lead frame in larger spacings as they have been in the wafer bond. Semiconductor chips 208 may be manufactured on the same wafer or different wafers. Semiconductor chips 208 may be identical chips or chips with different integrated circuits.

Semiconductor chips 208 may comprise source electrodes 210 and gate electrodes 212 that are disposed on a first surface 214 of the semiconductor chips 208. In one embodiment, connection LF elements 204 are electrically coupled to source electrodes 210 and connection LF elements 206 are electrically coupled to gate electrodes 212. The first surface 214 may also be referred to as a front side of the semiconductor chips 208. In one embodiment, electrical connections between connection LF elements 204, 206 of the lead frame 202 and source electrodes 210, gate electrodes 212 of the semiconductor chips 208 may, for example, be produced by diffusion soldering.

A diffusion solder material may be deposited on lead frame 202 and/or source electrodes 210 and gate electrodes 212 of semiconductor chips 208 by sputtering or other appropriate physical or chemical deposition methods. The solder material may have a thickness in a range of about 500 nm and about 10 um, for example, from about 1 to 3 um. During the soldering operation, the solder material diffuses into the adjacent materials on the lead frame surface 207, which leads to intermetallic phase at the interface between connection LF elements 204, 206 on the lead frame surface 207 and source electrodes 210, gate electrodes 212 of the semiconductor chips 208. The solder material may, for example, consist of AuSn, AgSn, CuSn, Sn, AuIn, AgIn, AuSi, or CuIn or layer stacks with or without diffusion barrier and/or adhesion layer.

In addition, electrical connections between connection LF elements 204, 206 of lead frame 202 and source electrodes 210, gate electrodes 212 of the semiconductor chips 208 may, for example, be produced by a flip-chip process in which the solder material is deposited on the semiconductor chips 208 and connection LF elements 204, 206 on lead frame surface 207 before the semiconductor chips 208 are removed from the wafer and placed over the lead frame surface 207.

Alternatively, electrical connections between connection LF elements 204, 206 of the lead frame 202 and source electrodes 210, gate electrodes 212 of the semiconductor chips 208 may be produced by connection techniques such as soft soldering or solder paste or adhesive bonding by means of an electrically conducting adhesive glue. When using soft soldering technique, solder material remains at the interfaces between the semiconductor chips 208 and lead frame surface 207 after soldering. When using solder paste or adhesive bonding, electrically conducting adhesive material, such as filled or unfilled polymides, epoxy resins, acrylate resins, silicone resins or mixtures thereof, may be used and enriched with gold, silver, nickel, copper or/and CNT to produce electrical conductivity.

Semiconductor chips 208 may also comprise drain electrodes 216 that are disposed on a second surface 218 of the semiconductor chips 208. The second surface 218 may also be referred to as a back side of the semiconductor chips 208. However, unlike source electrodes 210 and gate electrodes 212 that are disposed on the first surface 214, drain electrodes 216 are not processed and without any metallization on the second surface 218 of the semiconductor chips 208.

Figure 2C:
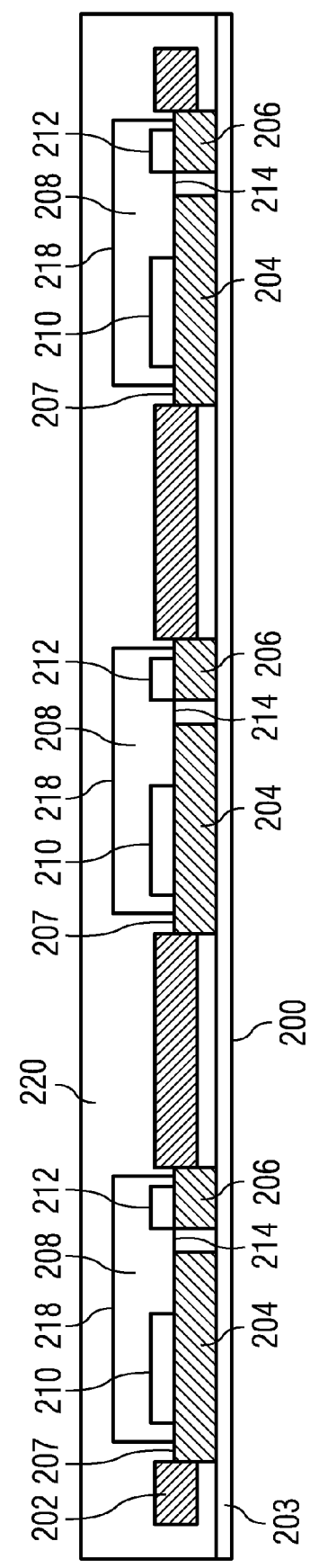

Referring to FIG. 2C, after semiconductor chips 208 are placed on the stamped or etched lead frame 202, semiconductor chips 208 and lead frame 202 are encapsulated by an encapsulating material, such as a mold material 220 to form a molding. The mold material 220 may be based on an epoxy material and may contain a filler material consisting of small particles of glass ($SiO_2$) or other electrically insulating mineral filler material such as $Al_2O_3$, AlN, Bornitrite or/and organic filler materials. The thickness of the mold material 220 may be in the range of 200 to 1500 um. In addition to the second surface 218 being covered by the mold material 120, side surfaces of semiconductor chips 208 may also be covered by the mold material 220

Figure 2D:
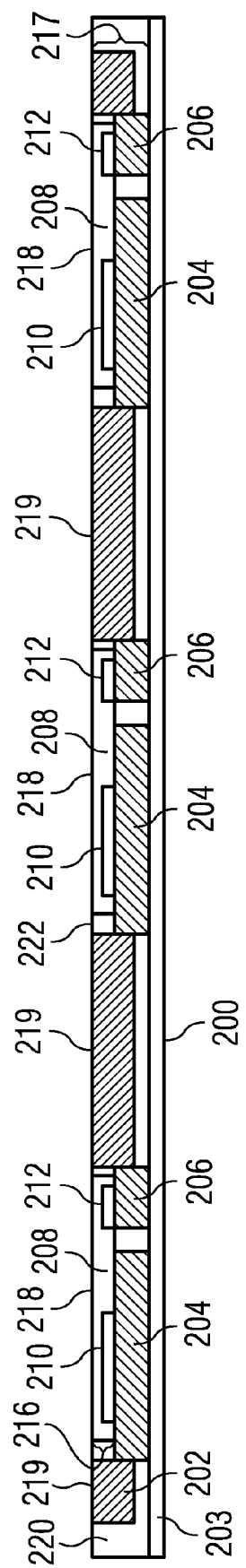

Referring to FIG. 2D, after the molding 220 is formed, semiconductor chips 208 are thinned or grinded. In one embodiment, the semiconductor chips 208 are grinded to a thickness 216 of less than about 150 um, for example, 100 um. During thinning or grinding of semiconductor chips 208, the thickness 217 of the mold material 220 and lead frame 202 are also reduced such that all interfaces lead frame 202, mold material 220 and semiconductor chips 208 are substantially coplanar or at about the same level. For example, the mold material 220, the lead frame 202 and the semiconductor chips 208 may be thinned or grinded to a thickness of less than about 150 um. In addition, more than one semiconductor chips 208 may be thinned simultaneously.

To thin or grind semiconductor chips 208, mold material 220 and lead frame 202, grinding machines that are similar to wafer grinding machines may be used. In one embodiment, etching may be used to reduce thickness of the semiconductor chips 208. After grinding, a damage etching process may be performed to remove transition and crack zones caused by grinding. Alternatively, a chemical mechanical polishing process may be carried out. After thinning or grinding, the top surface 222 of the mold material 220 is substantially coplanar with the exposed second surface 218 of the semiconductor chips 208, and the exposed surface 219 of the lead frame 202.

After semiconductor chips 208, lead frame 202, and the molding material 220 are grinded or thinned, finishing process may be performed on the thin semiconductor device. Referring to FIG. 2E, in one embodiment, a barrier layer may first be deposited onto the back surface 218 of the semiconductor chips 208, top surface 222 of the mold material 220, and the exposed surface 219 of the lead frame 202 (or connection LF elements 204, 206). The barrier layer may be composed of an electrically conductive material, such as titanium or tungsten. In one example, the thickness of the barrier layer may be from about 50 um to about 400 um. Then a seed layer may be sputtered onto the barrier layer. The seed layer may be composed of an electrically conductive material, such as copper. In one example, the thickness of the seed layer may be from about 50 um to about 400 um.

Once the barrier and/or seed layer is deposited, another layer of electrically conductive material, such as copper, is galvanically deposited. A photoresist may first be applied over the barrier layer and/or seed layer. The photoresist covers the entire barrier and/or seed layer except the back surface 218 of the semiconductor chips 208. The photoresist achieves good adhesion to the conductive barrier and/or seed layer and may be removed easily with common wet etching technique. The photoresist is then exposed and developed with resist mask.

An electrically conductive material, such as copper, may then be produced by using electrochemical process with external current and is deposited over the back side 218 of the semiconductor chips 208. The layer of electrically conductive material may be greater than 20 um. After the the electrically conductive material is deposited, portions of the electrically conductive material layer are subsequently removed to form electrical contact elements 238. To remove portions of the electrically conductive material, the photoresist is stripped and the barrier and/or seed layer are removed chemically, for example, by wet etching. After portions of the electrically conductive material is removed, electrical contact elements 238 provide electrical contact from outside the mold material 220 to drain electrodes 216 that is not processed and without any metallization and is disposed on the second surface 218 of semiconductor chips 208.

In the above embodiment, portions of the electrically conductive material layer may be removed by wet etching. However, portions of the electrically conductive material layer may be removed using other methods without departing the spirit and scope of the present disclosure. After electrical contact elements 238 are formed to provide electrical contact to drain electrodes 216 of the semiconductor chips 208, an electroless plating process may be performed to enhance electrical bonding of electrical contact elements 238. A coating composed of Ni, Pd, Au, NiAu, etc., may be applied over electrical contact elements 238 to provide better electrically conductivity.

After electroless plating process is completed, semiconductor packages are formed by singulation. In one embodiment, the singulation is performed by singulating the mold material 220 and the lead frame 202 along lines 240. However, singulation along other positions or by other means may be used without departing the spirit and scope of the present disclosure.

In addition, while a particular feature or aspect of an embodiment of the invention may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". The terms "coupled" and "connected", along with derivatives may have been used. It should be understood that these terms may have been used to indicate that two elements co-operate or interact with each other regardless whether they are in direct physical or electrical contact, or they are not in direct contact with each other. Furthermore, it should be understood that embodiments of the invention may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed:

1. A semiconductor device comprising:
a lead frame disposed on a carrier, the lead frame comprising at least one connection element;
at least one semiconductor chip disposed on the lead frame;
an encapsulating material disposed over the at least one semiconductor chip and the carrier, wherein a surface of the encapsulating material facing away from the carrier is substantially coplanar with a surface of the semiconductor chip facing away from the carrier;
at least one through connection formed in the encapsulating material; and
at least one electrical contact element disposed over the at least one semiconductor chip and the at least one through connection wherein said at least one electrical contact element is formed over the at least one semiconductor chip and the at least one through connection in substantially the same plane.

2. The device of claim 1, wherein the at least one through connection is formed between a top surface of the lead frame and a top surface of the encapsulating material.

3. The device of claim 1, wherein the at least one semiconductor chip and the encapsulating material are reduced to a thickness of less than about 150 um.

4. A semiconductor device comprising:
a lead frame comprising at least one connection element, the lead frame being fixed on a carrier;
at least one semiconductor chip disposed over the lead frame;
a encapsulating material disposed over the at least one semiconductor chip and the lead frame, wherein a surface of the encapsulating material facing away from the carrier is substantially coplanar with a surface of the semiconductor facing away from the carrier; and
an electrical contact element disposed over the at least one semiconductor chip wherein said at least one electrical contact element is formed over the at least one semiconductor chip and is formed substantially at a level of said surface of said encapsulating material.

5. The device of claim 4, wherein the at least one semiconductor chip and the encapsulating material are reduced to a thickness of less than about 150 um.

* * * * *